United States Patent [19]

Bersin

[11] Patent Number: 4,689,112
[45] Date of Patent: Aug. 25, 1987

[54] METHOD AND APPARATUS FOR DRY PROCESSING OF SUBSTRATES

[75] Inventor: Richard L. Bersin, Orange, Conn.

[73] Assignee: Emergent Technologies Corporation, New Haven, Conn.

[21] Appl. No.: 918,545

[22] Filed: Oct. 10, 1986

Related U.S. Application Data

[63] Continuation-in-part of Ser. No. 824,438, Jan. 31, 1986, which is a continuation-in-part of Ser. No. 735,446, May 17, 1985, abandoned.

[51] Int. Cl.$^4$ .......................... B44C 1/22; B29C 37/00; C03C 15/00; C03C 25/06
[52] U.S. Cl. ................................. 156/643; 156/646; 156/655; 156/659.1; 156/668; 156/345; 204/192.32; 204/298
[58] Field of Search ............... 204/192 E, 192.32, 298; 156/643, 646, 655, 659.1, 662, 668, 345; 118/50.1, 620, 728; 427/38, 39

[56] References Cited

U.S. PATENT DOCUMENTS

| 4,579,623 | 4/1986 | Suzuki et al. | 156/626 |
| 4,595,452 | 6/1986 | Landau et al. | 156/643 |
| 4,612,085 | 9/1986 | Jelks et al. | 156/643 |
| 4,615,756 | 10/1986 | Tsujii et al. | 156/345 |

Primary Examiner—William A. Powell
Attorney, Agent, or Firm—St.Onge Steward Johnston & Reens

[57] ABSTRACT

This invention relates to an apparatus and process for the uniform dry process treatment of the surface of a substrate. More particularly, the invention relates to an apparatus and process wherein a gas plasma composition having at least one reactive specie is supplied through a first inlet port into a chamber means containing the substrate to be treated. A second gas is also supplied into the chamber through a second inlet port thereby redirecting the gas plasma composition into contact with the substrate in a substantially uniform manner.

32 Claims, 2 Drawing Figures

METHOD AND APPARATUS FOR DRY PROCESSING OF SUBSTRATES

This application is a continuation-in-part of application Ser. No. 824,438 filed Jan. 31, 1986 entitled Method and Apparatus for Dry Processing of Substrates and filed by Richard L. Bersin, which in turn is a continuation-in-part of application Ser. No. 735,446 filed May 17, 1985, now abandoned, entitled Method and Apparatus for Dry Processing of Substrates and filed by Richard L. Bersin.

BACKGROUND OF THE INVENTION

(1) Field of the Invention

This invention relates to a method and apparatus for dry process fabrication of devices from a substrate. In particular, a method for etching a substrate and stripping photoresist from a substrate during device fabrication is provided. More specifically, a substrate is exposed to a gas plasma composition having at least one reactive specie, but preferably being substantially free of electrically charged particles, wherein the gas plasma composition is uniformly directed onto the substrate by means of a stream of a second gas, thereby substantially avoiding recombination of the reactive specie of the gas plasma composition. The substrate may also be irradiated with ultraviolet radiation to enhance the reaction rate in a controlled manner and heated by infrared radiation. The constitution of the gas plasma composition and the temperature of the substrate may be adjusted to appropriately control the rates of the desired reactions.

(2) Description of the Prior Art

The use of a gas plasma in the fabrication of solid state devices is known in the prior art. Plasmas have been used both in the etching of semiconductor substrates and in the stripping or removal of photoresist layers from substrates.

Plasma processing, also known as dry processing or RIE (reactive ion etching), has several distinct advantages over more conventional processing methods, such as chemical or wet processing. Wet processes typically use toxic compositions to remove photoresist or to etch a layer or layers of material from a substrate. Such chemical compositions may be hazardous to the individual operator and to the environment if not carefully used. Waste disposal from wet etching processes can also present a problem.

Wet etching is isotropic in that etching proceeds at a substantially equal rate in all directions, thereby leading to an etch that extends not only downwardly in the desired direction but laterally as well. Isotropy produces an undesirable undercutting effect, reducing the distances between adjacent etches to often unacceptably small distances. If line widths, or the lateral distances between adjacent etches, must be held within very small tolerances such as those required for the small geometries of many LSI or VLSI devices, wet etching may not be usable. In many of these devices, the line tolerances are often comparable to the thickness of the films being etched, and anisotropy is therefore essential.

The isotropic etching that results from wet processes has become more unacceptable to the industry as the density of circuit elements placed on a single semiconductor substrate has increased. As element density increases, the line widths decrease, and isotropic etching becomes more unacceptable. Accordingly, the need for anisotropic or straight-walled etching has increased.

As compared to wet etching, dry etching provides the capability of anisotropic etching for holding line widths within specified tolerances. In the typical dry etching apparatus, the semiconductor wafers or substrates being processed are placed in a plasma etching chamber directly within the plasma or glow discharge region, where electrically charged particles and relatively strong electric fields are present. The presence of charged particles within the region of a strong electric field achieves anisotropy in the etching process, because the electric field imparts directionality to the charged etching species. Precise device fabrication is thereby possible.

However, the semiconductor layers on LSI or VLSI devices, such as for example a dielectric layer of silicon dioxide, can be relatively thin, perhaps on the order of 1 micron, and ion bombardment from the charged particles being accelerated into the layer by the electric field can result in electrical anomalies or unacceptable damage to the layer, known generally as radiation damage. As oxide layers decrease in thickness, the number of defective chips and reduction of chip yields per wafer caused by radiation damage increases to unacceptable proportions.

Radiation damage is likewise a problem in dry photoresist strippers, and is not a problem limited only to plasma etching. Also, static charge build up on the surface of exposed dielectric layers. For example, EPROM devices normally incorporate a dielectric oxide layer only 100 angstroms thick. Static charging of the dielectric layer during dry stripping of photoresist can result in dielectric breakdown and resultant inoperability of the device.

Dry etching devices wherein the substrate being etched is removed from the plasma itself, i.e. "downstream" etching apparatus, are known in the art. However, while the problem of radiation damage is reduced, the typical downstream device suffers from the same inadequacy as wet etching devices in that etching is unacceptably isotropic, because in the downstream device there is typically no electric field to impart and directionality to the etching species.

U.S. Pat. No. 4,233,109 to Nishizawa discloses a plasma etching method using a plasma generator to ionize a reaction gas into a plasma state. The generator is connected to a processing chamber by a nozzle for introducing the plasma into the chamber, which contains a workpiece to be processed.

It is also known to use photons to affect the action of a plasma reactor. U.S. Pat. No. 4,183,780 to McKenna et al. describes a method and apparatus for photon enhanced reactive ion etching, wherein the plasma reactor includes means for emitting selected wavelengths of vacuum ultraviolet and directing this radiation to the plasma, preferably adjacent the substrate to control the plasma process, especially at the substrate. U.S. Pat. No. 4,404,072 to Kohl and U.S. Pat. No. 4,478,677 to Chen et al. disclose the use of light in etching methods.

However, a distinct disadvantage of prior art methods utilizing a downstream device is the recombination of the reactive specie of the plasma caused by contact of the plasma with solid surfaces such as conduit walls, nozzles and other devices for directing the flow of plasma gas. This recombination of the plasma gas reactive specie severely limits the ability of the plasma gas to adequately etch the substrate.

SUMMARY OF THE INVENTION

In accordance with the present invention, an apparatus and process for removing or stripping photoresist from a substrate and also etching a substrate is provided.

In one preferred embodiment for removing photoresist, a gas plasma is produced from a gas mixture comprising oxygen, $CF_4$, nitrogen, and hydrogen. Any electrically charged particles are substantially eliminated from this plasma to form a plasma effluent. The substrate from which photoresist is to be removed is heated, preferably by infrared radiation, to a temerature in the range of about 250 degrees to 300 degrees Centigrade (°C.). the substrate and the photoresist thereon is then exposed to the plasma effluent by provision of a stream of plasma effluent into the reaction chamber simultaneously with a stream of a second gas which serves to uniformly direct the plasma effluent onto the substrate, and the substrate is simultaneously irradiated with collimated ultraviolet radiation.

In another preferred embodiment, also for removing photoresist, the gas plasma is produced from a gas mixture comprising oxygen, nitrogen, and hydrogen and the substrate is heated to a temperature of greater than about 275° C.

In yet another preferred embodiment, this embodiment for etching the substrate, the gas plasma comprises $CF_4$ and oxygen and the substrate is heated to a temperature of approximately 200° C.

The present invention makes it possible to independently control the type of reactive chemical species in the plasma, the UV excitation, and temperature to optimize the photoresist stripping or the etching process. Moreover, the plasma gas is uniformly contacted with the surface of the substrate, resulting in more uniform stripping or etching, without the disadvantageous effects of using conventional means such as nozzles and the like. In the typical prior art plasma system, these parameters are inextricably interwoven such that independent control and uniformity and therefore optimization is impossible.

Because the process of the present invention is essentially a chemical process carried out where there are substantially no ions and particle energies are relatively low, chemical selectivities to achieve high etch rates for materials over substrates which etch very slowly to minimize substrate damage can be much better controlled than within the typical prior art plasma system. Also, unique chemical selectivities which may also be temperature dependent provide means for additional control of the processes.

It is an object of this invention to provide a dry etching apparatus and process wherein the deleterious effects of non-uniform contact of plasma gas to substrate are minimized.

It is a further object of this invention to provide a dry etching apparatus and process wherein anisotropic etching can be achieved using a downstream system.

It is a further object of this invention to provide an apparatus and process for efficient dry stripping of photoresist from semiconductor wafers with a minimum of destructive etching and radiation damage.

It is a further object of this invention to provide a process for removing photoresist at a relatively high rate with negligible etching of exposed substrate material.

It is a further object of this invention to provide a process for maximizing the rate of etching the exposed substrate, while minimizing the rate of removal of the photoresist Further attendant advantages of the apparatus and process of the present invention will be apparent from the following brief description of the drawings and detailed description of the preferred embodiment.

DETAILED DESCRIPTION OF THE PREFERRED EMBODIMENT

Figure 1:
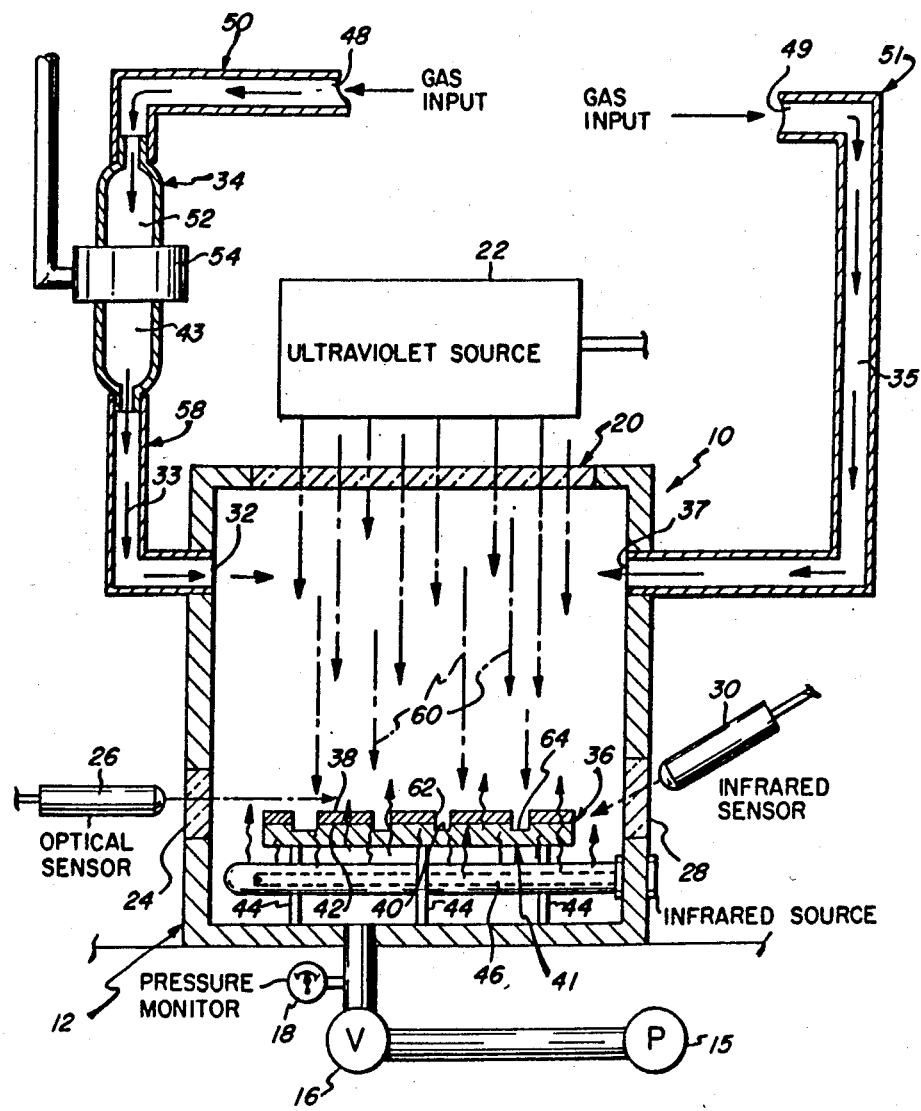
FIG. 1 is a sectional side view depicting an apparatus for practicing the method of the present invention.

FIG. 1 depicts an apparatus 10 for processing a substrate. This process can be etching of a semiconductor or other substrate, such as silicon or polysilicon; stripping or removal of organic photoresist layers from a substrate; or other similar treatment of the surface of a substrate.

Apparatus 10 comprises reaction chamber 12 for containing at least one substrate 36 to be processed. Chamber 12 can be any suitable means for containing the substrate and is typically a sealed chamber capable of maintaining a vacuum down to approximately 0.01 mm Hg. Pump P denoted as 15 in FIG. 1, in conjunction with valve V denoted as 16, controls evacuation of chamber 12 and maintains a vacuum. The system exhaust is controlled independently of the gas inputs, described more fully below, thereby allowing control of mass flow independent of pressure and gas resident time in the chamber. Pressure monitor 18 gives an indication of the pressure or vacuum maintained inside chamber 12.

Chamber 12 preferably has a thick, vacuum-rated, clear fused quartz window 20 positioned in a first side of the chamber 12 shown as the upper side in FIG. 1. As will be described in more detail below, ultravioled (UV) radiation from an ultraviolet source 22 can be directed through window 20 to the substrate 36 being processed inside chamber 12. Window 20 can comprise any suitable material for transmitting ultraviolet radiation other than quartz, such as for example fused silica. Chamber 12 preferably also has a window 24 comprised of quartz for permitting optical sensor 26 to monitor chemiluminescent emissions. Chamber 12 preferably further has a window 28 comprised of calcium fluoride, zinc selenide, or other material transparent to infrared radiation for permitting infrared detector 30 to monitor the substrate temperature.

Reaction chamber 12 has a first inlet port 32 for receiving a gas plasma composition 33 from a plasma generator indicated generally as 34. plasma generator 34 will be described more fully in detail below. Reaction chamber 12 also has a second inlet port 37 for receiving a second gas 35.

Chamber 12 contains the substrate to be processed, indicated as 36 in FIG. 1. Substrate 36 can be for example any semiconductor such as silicon, germanium, or gallium arsenide, or a semiconductor with an oxide layer grown thereon, such as silicon dioxide. The apparatus shown in FIG. 1 is also suitable with slight modifications evident to those of skill in the art for processing other substrates such as chrome or metal masks.

Wafer 36 is depicted as having a patterned layer of developed photoresist 38 deposited thereon, the pattern leaving certain portions 40 of the wafer 36 exposed and certain other portions 42 covered. FIG. 1 also shows wafer 36 having etches 40 formed therein. Etches 40 have floors 64 and sidewalls 62, although it is understood that these floors or sidewalls are not necessarily planar as shown in FIG. 1.

In the preferred embodiment of FIG. 1, the substrate or silicon wafer 36 comprises a first surface 39 and a second surface 41. The wafer 36 is advantageously supported by a set of three elongated pointed quartz pin members 44, so as to have minimal contact area with wafer 36, such that the first surface 39 is positioned for irradiation from UV source 22. This set of pins 44 is preferred in that such a support means enables the substrate to be heated uniformly from below; however, any suitable means for holding the substrate 36 can be used as well.

An infrared source 46 is preferably positioned underneath the substrate 36 inside chamber 12. This infrared source 46 provides infrared radiation in the wavelength of about 1 to about 10 microns for heating the wafer by irradiating the second surface 41. In the case of a silicon substrate, the silicon is substantially transparent to infrared radiation, and a film, such as a layer of photoresist 38, can be heated from below by infrared source 46 without substantially heating the silicon substrate. In this way, the film of photoresist 38 can be heated substantially independently of irradiation with UV.

In this apparatus the wafers reside on three pins, which are thermally isolated. When a wafer is placed onto the process chamber, it is at room temperature. With this thermal isolation, the heat lamps can be ignited and the wafer heated to 300° C. in 5 seconds, for example. The heat lamps can then be turned off, and the thermal isolation coupled with the vacuum permits the stripping rates mentioned hereinafter, without the need of having a massive wafer substrate-holder constantly maintained at high temperature.

This advantage allows the single wafer processing system to show a high throughput of wafers per hours, with simple cooling requirements.

A glass plasma 43, which provides at least one reactive specie for etching the substrate or stripping the photoresist from the substrate, is produced by plasma generator 34. A gas or mixture of gases suitable for the particular substrate 36 being processed or the photoresist being removed is introduced at 48 and flows through conduit 50 to plasma chamber 52. Examples of such gases include freon 14 or oxygen. The gas inputs and mass flow control devices are well known in the art and are not shown.

Preferably, plasma generator 34 comprises microwave exciter 54 which energizes the gas in plasma chamber 52 into the plasma 43. Such microwave exciter 54 is driven by a microwave generator comprising a magnetron whose frequency is about 2450 Megahertz and whose output is typically up to about 1000 watts and preferably between about 500 and 1000 watts. The microwaves are directed to chamber 52, where a plasma or glow discharge region is created. It is understood that the scope of the present invention is not limited to a microwave plasma generator herein described, but could equally be by any means for generating a gas plasma, such as for example a radio frequency generator.

The gas plasma 43 created by the microwave energy typically comprises ions, free electrons, atoms, molecules, free radicals, and other excited species, such as electronically excited species. The free radicals bear no net electric charge, but the constituent gases entering at 48 can be chosen so that the resultant free radicals comprise at least one reactive specie which is reactive with the substrate material being removed, such as the substrate being etched or the photoresist being removed from the substrate For example, if the constituent gas is oxygen ($O_2$), then the resultant plasma will comprise at least the free radical or reactive specie O (atomic oxygen), which is reactive with materials such as organic photoresists. The constituent gas mixtures can be controlled by well known mass-flow control devices for precision. It may also be desirable to inject other gases downstream of the plasma generator.

This plasma 43 in the glow discharge region of plasma chamber 34 also comprises ions and free electrons, which would bombard and possibly damage the substrate 36 if the substrate 36 were adjacent to or immersed in the glow discharge region. However, plasma generator 34 is located in a region relatively remote from reaction chamber 12, which is located downstream from plasma generator 34. Reaction chamber 12 is connected to plasma chamber 34 by conduit 58, which is preferably of a length sufficient to form a plasma effluent by permitting a substantial portion of the ions and free electrons in the plasma in chamber 34 to recombine or dissipate before the plasma 43 flows downstream through conduit 58 to chamber 12. Other suitable means for eliminating a substantial portion of the ions and free electrons in the plasma to form plasma effluent will be apparent to the skilled artisan and are equally useful herein.

Accordingly, gas plasma composition 33 that enters the reaction chamber is preferably plasma effluent, having substantially no ions or electrons present. Alternatively, gas plasma composition 33 may be comprised of gas plasma 43. The surface of the substrate is thereby subjected to dry processing by being exposed to a gas comprising at least one reactive specie for reacting with the surface, without the presence of electrically charged particles. A particularly preferred reactive specie comprises at least one free radical, such as for example atomic oxygen.

In apparatus 10 described herein, based on lifetimes of approximately microseconds for the ions and free electrons and approximately milliseconds to seconds for the free radicals or reactive species, the preferred length of conduit 58 is approximately 4 to 12 inches at a plasma flow rate of 1000 standard cubic centimeters per minute (sccm). The rate of mass change in the chamber 12 is preferred to be approximately above 100 changes/minute and most preferably about 800 changes/minute. The reactive species, which have significantly greater lifetimes as compared to the ions and free electrons, reach reaction chamber 12 for reaction with the substrate 36, which is thereby subjected to a gas plasma composition 33 comprising plasma effluent, substantially free of electrically charged particles.

A gas or mixture of gases suitable for use as the second gas 35, described more fully in detail below, is introduced at 49 and flows through conduit 51 to reaction chamber 12. Examples of suitable gases include those used to form gas plasma composition 33, although such is not required. Other suitable gases include inert gases such as argon, helium and xenon. The gas inputs and mass flow control devices are well known in the art and are not shown. In practice, the second gas 35 may also be a plasma. Where the gases used to form second gas 35 are the same as those used to form gas plasma composition 33, the gas inputs and mass flow control devices may be partially or wholly coextensive with those for introducing gases at 48.

Ultraviolet source 22 is provided for irradiating the substrate 36 with ultraviolet radiation and thereby enhancing the reaction rate of the at least one reactive specie in the gas plasma composition introduced into chamber 12. The preferred ultraviolet source for use in the present invention emits electromagnetic radiation in the range of about 1000 to about 3000 angstroms, although other types of UV radiation such as vacuum ultraviolet can be used.

Ultraviolet source 22 also collimates the UV radiation by means of a standard arrangement of mirrors and lenses, so that the UV rays strike the floor 64 of the exposed substrate surface etches 40 at an angle substantially normal to the surface of the substrate and the floor 64 of the etch. The UV rays indicated generally as arrows 60 can by proper aiming of the collimated UV radiation be made to strike the substrate 36 at approximately a 90° angle. The UV radiation if substantially not incident on the sidewalls 62 of the etch 40. Accordingly, the etch rate is enhanced on the floor 64 of the etch 40 and is substantially slower on the sidewall 62. In this way, the use of such normally-collimated UV radiation achieves substantially anisotropic etching.

It can be seen that the apparatus disclosed above in FIG. 1 can be used in a process to produce a solid state device not only by producing substantially straight walled etches 40 in a substrate 36, but also where there is a need for removing any predetermined potions of a layer of material from the surface of a substrate 36. For example, the removal of developed organic photoresist 38 from the surface of a substrate 36 such as a silicon wafer can be achieved just as can the normal of silicon by an etching procedure.

The first step of the method is exposing the predetermined portions of the layer of material to be removed to a gas plasma composition 33. The plasma 43 is produced in a region relatively remote from the substrate 36, so that the substrate is not subjected to the relatively strong electric fields and ion bombardment associated with the glow discharge region of a plasma. The portions to be removed can be predetermined by means of standard photolithographic methods.

The gas plasma composition 33 is chosen to comprise at least one reactive specie; the electrically charged particles having preferably been substantially removed or eliminated from the plasma to form plasma effluent so that the gas plasma composition is substantially free of ions or free electrons, whereby the damage to the substrate from ion bombardment is minimized. This substantial elimination of the electrically charged particles can be advantageously accomplished by transferring the gas plasma composition to reaction chamber 12 over a distance sufficiently long to permit any electrically charged particles, such as ions or free electrons, to be dissipated by recombination.

It is important in producing solid state devices, that the stripping or etching rate be as uniform as possible over the surface 39 of the substrate 36 to be etched or stripped. Advantageously, therefore, the predetermined portions of the layer of material to be removed are exposed to a gas plasma composition 33 by directing gas plasma composition 33 uniformly over those predetermined portions. Conventional mechanical means, such as baffles, nozzles and the like, are unsuitable for this purpose due to the fact that such solid surfaces lead to a substantial amount of recombination of the reactive specie of gas plasma composition 33 due to collisions therewith. This effect can be substantially avoided by using a second gas 35 to direct gas plasma composition 33 uniformly over the predetermined portions. The rate of recombination due to collisions with a second gas is orders of magnitude smaller than the rate of recombination due to collisions with a solid surface (see, Einspruch, *VLSI Electronics Microstructure Science*, vol. 8, Academic Press, Inc. 1984).

Advantageously, the uniform direction of gas plasma composition 33 over the predetermined portions is accomplished by supplying gas plasma composition 33 into reaction chamber 12 through inlet port 32 in such a manner as to create a stream of gas plasma composition 33 flowing into reaction chamber 12 with a first directional component substantially parallel to substrate 36. Simultaneously, a second gas 35 is supplied into reaction chamber 12 through inlet port 37 in such a manner as to create a stream of the second gas 35 flowing into reaction chamber 12 with a second directional component substantially parallel to substrate 36, so that the stream of second gas 35 collides with the stream of gas plasma composition 33 and thereby redirects gas plasma composition 33 into uniform contact with the predetermined portions. Most preferably, the directional component of the second gas 35 is 180° from the directional component of the gas plasma composition 33. The flow rate of the second gas 35 is advantageously at a rate designed to facilitate the uniform direction of gas plasma composition 33 onto substrate 36. The preferred rate will vary depending on the molecular weight of the second gas 35 relative to the gas plasma composition 33. For instance, when the second gas 35 is comprised of the same gaseous constituent as gas plasma composition 33, the flow rate of the second gas 35 is preferably about 0.50 to about 0.85 times that of gas plasma composition 33. More preferably, the flow rate of the second gas is about 0.70 to about 0.80 times that of the gas plasma composition 33.

Simultaneously with exposure to the gas plasma composition 33, the portions of the substrate layer where the reaction rate such as the etching rate or the photoresist stripping rate is to be enhanced is irradiated with electromagnetic radiation comprising ultraviolet radiation 60. The substrate may also be irradiated with electromagnetic radiation comprising infrared radiation, preferably in the wavelength range of about 1 to about 10 microns, to heat the substrate 36. If anisotropic etching is to be achieved, the ultraviolet radiation 60 should be normally collimated so that the proper directionality can be imparted to the reactive specie.

Although the method and apparatus of the present invention is described in terms of a dry process using a gas plasma composition, it is understood that the present invention contemplates any dry process employing a chemically reactive specie, such as for example a free radical, in conjunction with UV radiation to selectively enhance reaction rates on predetermined portions of a substrate in which recombination of the reactive specie is substantially avoided by uniformly directing the reactive specie onto the substrate with a stream of a second gas. The use of a gas plasma composition having substantially no charged particles present (i.e., plasma effluent) is preferred as being a particularly efficient way of practicing the present invention.

The method of the present invention is particularly suited to the processing of one wafer at a time, known as single wafer processing. There are two particularly preferred types of processes for which this method applies by way of example only; first, the stripping of photoresist from a wafer which has exposed other surfaces, such as silicon nitride, silicon oxide, or polysilicon, wherein it is desired to remove the photoresist at a relatively high rate with negligible etching of the other exposed substrate material; second, maximization of the rate of etching of the exposed substrate and minimization of the rate of removal of the photoresist.

The apparatus described above with respect to FIG. 1 is well suited to the accomplishment of these objectives through appropriate utilization of gas mixtures to generate the optimal free radical species mixture, utilization of an advantageous means for redirecting the optimal free radical species mixture onto the substrate uniformly, optimization of the temperature by independent control through infrared heating with lamps as described hereinbefore, and maintenance of the optimal pressure through control of the total mass flow rates of gases employed and throttling of the exhaust pumping system shown at 15 and 16.

These conditions are preferably achieved utilizing a gas mixture input at 48 in FIG. 1 comprising 1020 sccm of oxygen gas, 100 sccm of $CF_4$ gas, and 120 sccm of a premix gas of 97% nitrogen by volume and 3% hydrogen by volume and a gas mixture input at 49 in FIG. 1 comprising 765 sccm of oxygen gas, 75 sccm of $CF_4$ gas, and 90 sccm of a premix gas of 97% nitrogen by volume and 3% hydrogen by volume. The preferred chamber pressure is 0.45 torr with a preferred dissipation of 400 watts of microwave power in the discharge region to generate the free radicals. In addition, this result is achieved with no radiation damage of any kind to the wafers, and no effect on their electrical properties of devices, such as threshold voltage shifts or dielectric breakdown.

Another preferred set of stripping conditions, which employs no halogen gas at all, produces a very high chemical selectivity because etching of the substrate is minimal if freon is not present. The preferred gas mixture comprises 1020 sccm of oxygen with 120 sccm of the premix of 97% nitrogen and 3% hydrogen at the gas input at 48 in FIG. 1 and 765 sccm of oxygen with 90 sccm of the premix of 97% nitrogen and 3% hydrogen, under the same conditions of microwave power and pressure indicated above.

Figure 2:
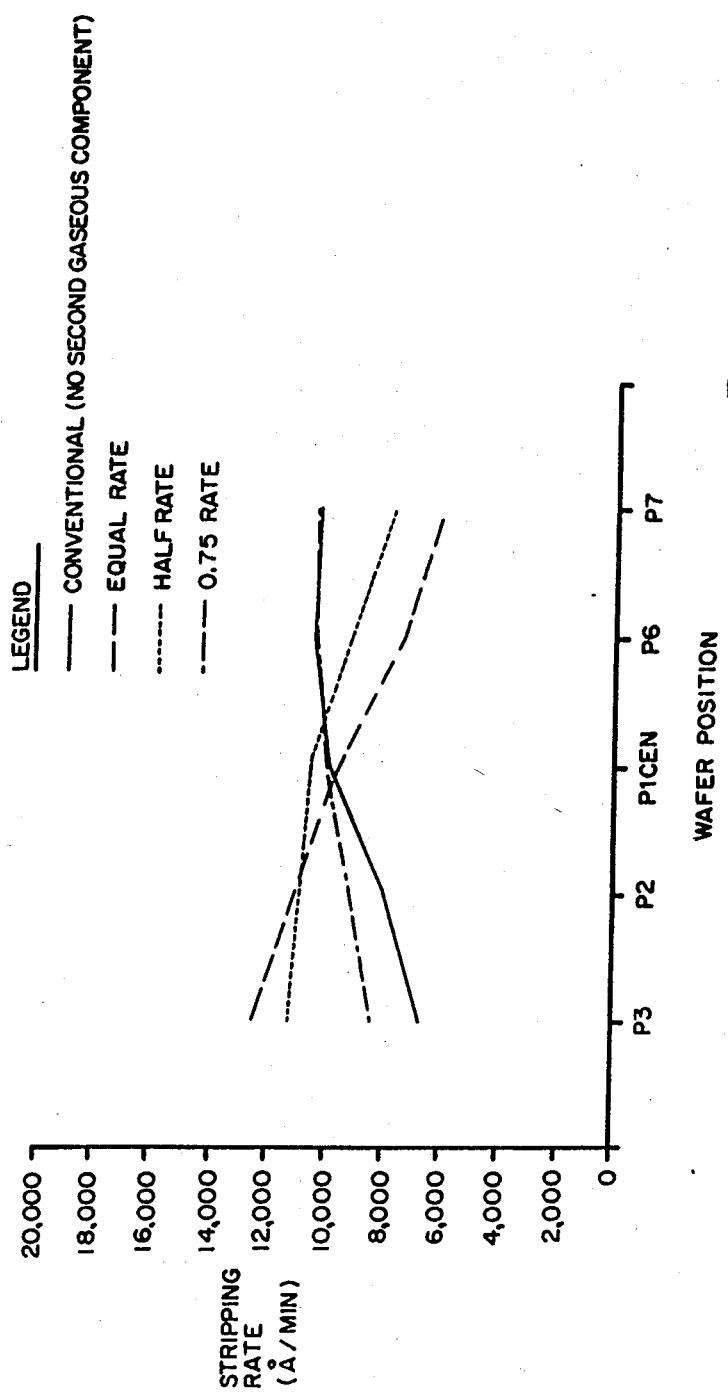
FIG. 2 is a plot of stripping rate versus wafer position for preferred embodiments of the present invention as compared to a prior art method.

In accordance with the present invention, it is demonstrated that, through appropriate adjustment of the relative flow rate of the second gas 35, the stripping can be made more uniform over the surface of the substrate being stripped. In FIG. 2, a plot of stripping rate versus position on the wafer shows that conventional methods, wherein a second gas is not used, lead to a stripping rate which varies by ±30% over the surface of the wafer. Where a second gas is utilized having the same constituents as the gas plasma composition, a flow rate of half or 0.75 that of the gas plasma composition is shown to lead to superior uniformity of stripping rate over the surface of the wafer, as shown plotted in FIG. 2. For instance, a flow rate of 0.75 leads to a stripping rate which varies by ±10% over the surface of the wafer, and a flow rate of half leads to a stripping rate which varies by ±17%.

It should be understood that various changes and modifications of the preferred methods and embodiments described above will be apparent to those of skill in the art. Such changes and modifications can be made without departing from the spirit and scope of the present invention, and it is therefore intended that such changes and modifications be covered by the following claims.

What is claimed is:

1. An apparatus for the uniform dry process treatment of the surface of a substrate, the apparatus comprising:
    (a) a chamber means containing the substrate to be treated;
    (b) a means for generating a gas plasma composition having at least one reactive specie;
    (c) a means operatively connecting said generating means with said chamber means for supplying the gas plasma composition into said chamber means through a first inlet port, thereby exposing the substrate to the first gas; and
    (d) a means operatively connected to said chamber means for supplying a second gas into said chamber means through a second inlet port thereby redirecting the gas plasma composition into contact with the substrate in a substantially uniform manner.

2. The apparatus of claim 1 wherein the gas plasma composition is supplied into said chamber means in a stream having a first directional component and the second gas is supplied into said chamber means in a stream having a second directional component, thereby redirecting the gas plasma composition into substantially uniform contact with the substrate.

3. The apparatus of claim 2 wherein the second directional component is 180° from the first directional component.

4. The apparatus of claim 2 wherein the first and second directional components are each substantially parallel to the substrate.

5. The apparatus of claim 1 wherein the gas plasma composition is selected from the group consisting of oxygen, nitrogen, $CF_4$, hydrogen and mixtures thereof.

6. The apparatus of claim 1 wherein the second gas is selected from the group consisting of oxygen, nitrogen, $CF_4$, hydrogen, argon, helium, zenon and mixtures thereof.

7. The apparatus of claim 5 wherein the second gas is comprised of the same consitiuent gas as the gas plasma composition.

8. The apparatus of claim 6 wherein the second gas is a second plasma.

9. The apparatus of claim 7 wherein the flow rate of the second gas is about 0.50 to about 0.85 times that of the gas plasma composition, thereby redirecting the gas plasma composition into substantially uniform contact with the substrate.

10. The apparatus of claim 1 wherein said gas plasma composition supply means further comprises a means for substantially eliminating any electrically charged particles in the gas plasma composition.

11. The apparatus of claim 10 wherein said eliminating means comprises a conduit having sufficient length to permit any electrically charged particles in the gas plasma composition to be dissipated.

12. The apparatus of claim 1 wherein said chamber means is capable of maintaining a vacuum.

13. The apparatus of claim 12 which further comprises a vacuum means operatively connected to said chamber means.

14. The apparatus of claim 1 which further comprises a first irradiating means for irradiating the surface of the substrate to be treated with electromagnetic radiation comprising collimated ultraviolet radiation.

15. The apparatus of claim 1 which further comprises a second irradiating means for irradiating the substrate with infrared radiation.

16. The apparatus of claim 15 wherein said chamber means further comprises a means for holding the substrate in a position whereby the substrate may be irradiated by the first and second irradiating means.

17. The apparatus of claim 16 wherein said holding means comprises a plurality of elongated quartz members.

18. The apparatus of claim 15 wherein the second irradiating means heats the substrate to between about 250° to about 300° C.

19. A process for the uniform dry process treatment of the surface of a substrate, the process comprising:
(a) generating a gas plasma composition comprising a plasma having a least one reactive specie;
(b) supplying a stream of the gas plasma composition into a chamber means containing the substrate to be treated through a first inlet port; and
(c) supplying a stream of a second gas into said chamber means through a second inlet port thereby redirecting the gas plasma composition into contact with the substrate in a substantially uniform manner.

20. The process of claim 19 wherein the stream of the gas plasma composition has a first directional component and the stream of the second gas has a second directional component.

21. The apparatus of claim 20 wherein the second directional component is 180° from the first directional component.

22. The apparatus of claim 20 wherein the first and second directional components are each substantially parallel to the substrate.

23. The apparatus of claim 19 wherein the gas plasma composition is selected from the group consisting of oxygen, nitrogen, CF$_4$, hydrogen and mixtures thereof.

24. The process of claim 19 wherein the second gas is selected from the group consisting of oxygen, nitrogen, CF$_4$, hydrogen, argon, helium, xenon and mixtures thereof.

25. The process of claim 23 wherein the second gas is comprised of the same constituent as the gas plasma composition.

26. The process of claim 24 wherein the second gas is a second plasma.

27. The process of claim 25 wherein the flow rate of the second gas is about 0.50 to about 0.85 times that of the gas plasma composition.

28. The process of claim 19 which further comprises substantially eliminating any electrically charged particles in the gas plasma composition prior to supplying the gas plasma composition into said chamber means.

29. The process of claim 19 which further comprises irradiating the substrate with collimated ultraviolet radiation.

30. The process of claim 19 which further comprises irradiating the substrate with infrared radiation to heat the substrate to a temperature of from about 250° to about 300° C.

31. The process of claim 19 which further comprises maintaining at least a partial vacuum in said chamber means.

32. A process for the uniform dry process treatment of the surface of a substrate, the process comprising:
(a) generating a gas plasma composition comprising a plasma having at least one reactive specie, the gas plasma composition selected from the group consisting of oxygen, nitrogen, CF$_4$, hydrogen and mixtures thereof;
(b) supplying a stream of the gas plasma composition having a first directional component substantially parallel to the substrate through a first inlet port into a chamber means containing the substrate to be treated;
(c) supplying a stream of a second gas, comprised of the same constituent gas as the gas plasma composition, having a second directional component 180° from the first directional component and substantially parallel to the substrate, through a second inlet port into said chamber means at a flow rate of about 0.50 to about 0.85 times that of the gas plasma composition, thereby redirecting the gas plasma composition into contact with the substrate in a substantially uniform manner.

* * * * *